(12) United States Patent
Hietala et al.

(10) Patent No.: US 12,092,689 B2
(45) Date of Patent: Sep. 17, 2024

(54) SCAN TEST IN A SINGLE-WIRE BUS CIRCUIT

(71) Applicant: Qorvo US, Inc., Greensboro, NC (US)

(72) Inventors: Alexander Wayne Hietala, Phoenix, AZ (US); Christopher Truong Ngo, Queen Creek, AZ (US); Ryan Lee Bunch, Colfax, NC (US)

(73) Assignee: Qorvo US, Inc., Greensboro, NC (US)

( * ) Notice: Subject to any disclaimer, the term of this patent is extended or adjusted under 35 U.S.C. 154(b) by 114 days.

(21) Appl. No.: 17/545,113

(22) Filed: Dec. 8, 2021

(65) Prior Publication Data

US 2023/0176120 A1   Jun. 8, 2023

(51) Int. Cl.
*G01R 31/3177* (2006.01)
*G01R 31/28* (2006.01)
(Continued)

(52) U.S. Cl.
CPC ...... *G01R 31/3177* (2013.01); *G01R 31/2851* (2013.01); *G01R 31/2884* (2013.01);
(Continued)

(58) Field of Classification Search
CPC ........ G01R 31/3177; G01R 31/318572; G01R 31/31724; G01R 31/2851; G01R 31/3187;
(Continued)

(56) References Cited

U.S. PATENT DOCUMENTS

| 3,555,196 A | 1/1971 | Singer |
| 3,953,835 A | 4/1976 | Cuccio et al. |

(Continued)

FOREIGN PATENT DOCUMENTS

| CN | 101501607 A | 8/2009 |
| CN | 102591834 A | 7/2012 |

(Continued)

OTHER PUBLICATIONS

Final Office Action for U.S. Appl. No. 16/736,164, mailed Jan. 11, 2021, 10 pages.

(Continued)

*Primary Examiner* — April Y Blair
*Assistant Examiner* — Sazzad Hossain
(74) *Attorney, Agent, or Firm* — Withrow & Terranova, P.L.L.C.

(57) ABSTRACT

A Scan test in a single-wire bus circuit is described in the present disclosure. The single-wire bus circuit has only one external pin for connecting to a single-wire bus. Given that multiple physical pins are required to carry out the Scan test, the single-wire bus circuit must provide additional pins required by the Scan test. In embodiments disclosed herein, the single-wire bus circuit includes a communication circuit under test, and a driver circuit coupled to the communication circuit via multiple internal pins. The driver circuit uses a subset of the internal pins as input pins and another subset of the internal pins as output pins to carry out the Scan test in the communication circuit. As a result, it is possible to perform the Scan test without adding additional external pins to the single-wire bus circuit, thus helping to reduce complexity and footprint of the single-wire bus circuit.

20 Claims, 7 Drawing Sheets

(51) Int. Cl.
  *G01R 31/317* (2006.01)
  *G01R 31/3185* (2006.01)
  *G01R 31/3187* (2006.01)
  *G11C 29/32* (2006.01)
  *G11C 29/56* (2006.01)

(52) U.S. Cl.
  CPC .. *G01R 31/31712* (2013.01); *G01R 31/31713* (2013.01); *G01R 31/31724* (2013.01); *G01R 31/318572* (2013.01); *G01R 31/3187* (2013.01); *G11C 29/32* (2013.01); *G11C 2029/5602* (2013.01)

(58) Field of Classification Search
  CPC .......... G01R 31/2884; G01R 31/31713; G01R 31/31712; G11C 29/32; G11C 2029/5602
  See application file for complete search history.

(56) References Cited

U.S. PATENT DOCUMENTS

| | | |
|---|---|---|
| 4,336,447 A | 6/1982 | Oguchi et al. |
| 4,424,812 A | 1/1984 | Lesnick |
| 4,497,068 A | 1/1985 | Fischer |
| 4,736,367 A | 4/1988 | Wroblewski et al. |
| 5,412,644 A | 5/1995 | Herberle |
| 5,459,660 A | 10/1995 | Berra |
| 5,495,469 A | 2/1996 | Halter et al. |
| 5,499,247 A | 3/1996 | Matsuda et al. |
| 5,586,266 A | 12/1996 | Hershey et al. |
| 5,621,897 A | 4/1997 | Boury et al. |
| 5,684,803 A | 11/1997 | Nguyen Thuy |
| 5,734,847 A | 3/1998 | Garbus et al. |
| 5,748,675 A | 5/1998 | Hormel et al. |
| 5,774,680 A | 6/1998 | Wanner et al. |
| 5,787,132 A | 7/1998 | Kishigami et al. |
| 5,832,207 A | 11/1998 | Ittle et al. |
| 5,978,860 A | 11/1999 | Chan et al. |
| 6,094,699 A | 7/2000 | Surugucchi et al. |
| 6,141,708 A | 10/2000 | Tavallaei et al. |
| 6,189,063 B1 | 2/2001 | Rekeita et al. |
| 6,292,705 B1 | 9/2001 | Wang et al. |
| 6,308,255 B1 | 10/2001 | Gorishek, IV et al. |
| 6,310,408 B1 | 10/2001 | Hermann |
| 6,360,291 B1 | 3/2002 | Tavallaei |
| 6,397,279 B1 | 5/2002 | Jaramillo et al. |
| 6,408,163 B1 | 6/2002 | Fik |
| 6,484,268 B2 | 11/2002 | Tamura et al. |
| 6,985,990 B2 | 1/2006 | Bronson et al. |
| 7,197,589 B1 | 3/2007 | Deneroff et al. |
| 7,519,005 B2 | 4/2009 | Hejdeman et al. |
| 7,685,320 B1 | 3/2010 | Wishneusky |
| 7,729,427 B2 | 6/2010 | Kwok |
| 8,509,318 B2 | 8/2013 | Tailliet |
| 8,694,710 B2 | 4/2014 | Bas et al. |
| 8,775,707 B2 | 7/2014 | Poulsen |
| 9,152,598 B2 | 10/2015 | Fosse et al. |
| 9,166,584 B1 | 10/2015 | Kandala et al. |
| 9,252,900 B2 | 2/2016 | Poulsen |
| 9,430,321 B2 | 8/2016 | Slik |
| 9,519,612 B2 | 12/2016 | Hietala et al. |
| 9,569,386 B2 | 2/2017 | Du |
| 9,639,500 B2 | 5/2017 | Bas et al. |
| 9,652,451 B2 | 5/2017 | Elder |
| 9,690,725 B2 | 6/2017 | Sengoku |
| 9,755,821 B2 | 9/2017 | Jang et al. |
| 9,946,677 B2 | 4/2018 | Hapke |
| 10,176,130 B2 | 1/2019 | Ngo et al. |
| 10,185,683 B2 | 1/2019 | Ngo et al. |
| 10,558,607 B2 | 2/2020 | Ngo et al. |
| 10,599,601 B1 | 3/2020 | Ngo et al. |
| 10,983,942 B1 | 4/2021 | Ngo et al. |
| 11,113,220 B2 | 9/2021 | Ngo et al. |
| 2001/0050713 A1 | 12/2001 | Kubo et al. |
| 2004/0049619 A1 | 3/2004 | Lin |
| 2004/0100400 A1 | 5/2004 | Perelman et al. |
| 2004/0128594 A1 | 7/2004 | Elmhurst et al. |
| 2004/0221067 A1 | 11/2004 | Huang et al. |
| 2005/0012492 A1 | 1/2005 | Mihalka |
| 2005/0185665 A1 | 8/2005 | Uboldi |
| 2005/0259609 A1 | 11/2005 | Hansquine et al. |
| 2005/0289268 A1 | 12/2005 | Miller |
| 2006/0031618 A1 | 2/2006 | Hansquine et al. |
| 2006/0050694 A1 | 3/2006 | Bury et al. |
| 2006/0087307 A1 | 4/2006 | De Winter |
| 2006/0152236 A1 | 7/2006 | Kim |
| 2006/0236008 A1 | 10/2006 | Asano et al. |
| 2007/0073449 A1 | 3/2007 | Kraemer et al. |
| 2008/0217076 A1 | 9/2008 | Kraemer et al. |
| 2009/0121825 A1 | 5/2009 | Har |
| 2009/0248932 A1 | 10/2009 | Taylor et al. |
| 2010/0122103 A1 | 5/2010 | Roohparvar et al. |
| 2010/0305723 A1 | 12/2010 | Koyama |
| 2010/0306430 A1 | 12/2010 | Takahashi |
| 2011/0035632 A1 | 2/2011 | Hong et al. |
| 2011/0113171 A1 | 5/2011 | Radhakrishnan et al. |
| 2012/0027104 A1 | 2/2012 | Bas et al. |
| 2012/0030753 A1 | 2/2012 | Bas et al. |
| 2012/0161802 A1* | 6/2012 | Lebourg ......... G01R 31/318572 324/750.01 |
| 2012/0226965 A1 | 9/2012 | Hammerschmidt et al. |
| 2012/0303836 A1 | 11/2012 | Ngo et al. |
| 2013/0054850 A1 | 2/2013 | Co |
| 2013/0124763 A1 | 5/2013 | Kessler |
| 2013/0128724 A1 | 5/2013 | Farley et al. |
| 2013/0132624 A1 | 5/2013 | Chen et al. |
| 2013/0166801 A1 | 6/2013 | Chun et al. |
| 2013/0197920 A1 | 8/2013 | Lesso et al. |
| 2013/0265884 A1 | 10/2013 | Brombal et al. |
| 2013/0301689 A1 | 11/2013 | Marchand et al. |
| 2014/0025999 A1 | 1/2014 | Kessler |
| 2014/0112339 A1 | 4/2014 | Safranek et al. |
| 2014/0281593 A1 | 9/2014 | Hayes |
| 2014/0304442 A1 | 10/2014 | Hietala et al. |
| 2014/0310436 A1 | 10/2014 | Du |
| 2014/0376278 A1 | 12/2014 | Fornage et al. |
| 2015/0056941 A1 | 2/2015 | Lin et al. |
| 2015/0074306 A1 | 3/2015 | Ayyagari et al. |
| 2015/0097726 A1 | 4/2015 | Babitch et al. |
| 2015/0106541 A1 | 4/2015 | Southcombe et al. |
| 2015/0127862 A1 | 5/2015 | Fan et al. |
| 2015/0149673 A1 | 5/2015 | Balkan et al. |
| 2015/0169482 A1 | 6/2015 | Ngo et al. |
| 2015/0192974 A1 | 7/2015 | Ngo et al. |
| 2015/0193297 A1 | 7/2015 | Ngo et al. |
| 2015/0193298 A1 | 7/2015 | Ngo et al. |
| 2015/0193321 A1 | 7/2015 | Ngo et al. |
| 2015/0193373 A1 | 7/2015 | Ngo et al. |
| 2016/0050513 A1 | 2/2016 | Wang et al. |
| 2016/0124892 A1 | 5/2016 | Amarilio et al. |
| 2016/0224488 A1 | 8/2016 | Huang et al. |
| 2016/0224489 A1 | 8/2016 | Mishra et al. |
| 2016/0274185 A1* | 9/2016 | Nishikawa ..... G01R 31/318555 |
| 2017/0003344 A1* | 1/2017 | Uekusa ........... G01R 31/31723 |
| 2017/0104607 A1 | 4/2017 | Sengoku |
| 2017/0255250 A1 | 9/2017 | Ngo et al. |
| 2017/0255578 A1 | 9/2017 | Ngo et al. |
| 2017/0255579 A1 | 9/2017 | Ngo et al. |
| 2017/0277651 A1 | 9/2017 | Ngo et al. |
| 2017/0286340 A1 | 10/2017 | Ngo et al. |
| 2018/0032457 A1 | 2/2018 | Mishra et al. |
| 2018/0095119 A1* | 4/2018 | Chillara ................. H03L 7/08 |
| 2018/0217959 A1 | 8/2018 | Ngo et al. |
| 2018/0247876 A1* | 8/2018 | Kim ..................... G11C 29/32 |
| 2019/0025373 A1 | 1/2019 | Bradford |
| 2019/0250876 A1 | 8/2019 | Amarilio et al. |
| 2020/0081859 A1 | 3/2020 | Mishra et al. |
| 2020/0151131 A1 | 5/2020 | Ngo et al. |
| 2020/0334185 A1 | 10/2020 | Ngo et al. |
| 2020/0344094 A1 | 10/2020 | Mishra et al. |
| 2020/0394046 A1 | 12/2020 | Snelgrove et al. |

(56) References Cited

U.S. PATENT DOCUMENTS

| | | | |
|---|---|---|---|
| 2021/0382677 A1 | 12/2021 | Amarilio et al. | |
| 2022/0244309 A1* | 8/2022 | Sirisha | G01R 31/3183 |

FOREIGN PATENT DOCUMENTS

| | | |
|---|---|---|
| CN | 103870415 A | 6/2014 |
| CN | 104350700 A | 2/2015 |
| EP | 2466481 A1 | 6/2012 |
| WO | 2022081263 A1 | 4/2022 |

OTHER PUBLICATIONS

International Search Report and Written Opinion for International Patent Application No. PCT/US2020/012702, mailed Apr. 7, 2020, 17 pages.
Non-Final Office Action for U.S. Appl. No. 16/599,384, mailed Aug. 24, 2020, 8 pages.
Final Office Action for U.S. Appl. No. 16/599,384, mailed Dec. 1, 2020, 9 pages.
Non-Final Office Action for U.S. Appl. No. 16/549,116, mailed Aug. 6, 2020, 9 pages.
Final Office Action for U.S. Appl. No. 16/549,116, mailed Jan. 13, 2021, 9 pages.
Non-Final Office Action for U.S. Appl. No. 16/710,457, mailed Aug. 28, 2020, 7 pages.
Author Unknown, "IEEE Standard for Reduced-Pin and Enhanced-Functionality Test Access Point and Boundary-Scan Architecture," IEEE Std 1149.7™-2009, Feb. 10, 2010, IEEE, 1037 pages.
Kawoosa, M.S. et al., "Towards Single Pin Scan for Extremely Low Pin Count Test," 2018 31st International Conference on VLSI Design and 2018 17th International Conference on Embedded Systems (VLSID), Jan. 6-10, 2018, Pune, India, IEEE, 6 pages.
Advisory Action for U.S. Appl. No. 16/736,164, mailed Mar. 19, 2021, 3 pages.
Notice of Allowance for U.S. Appl. No. 16/736,164, mailed Apr. 29, 2021, 8 pages.
Advisory Action for U.S. Appl. No. 16/549,116, mailed Mar. 24, 2021, 3 pages.
Non-Final Office Action and Examiner-Initiated Interview Summary for U.S. Appl. No. 16/549,116, mailed May 12, 2021, 10 pages.
Applicant-Initiated Interview Summary for U.S. Appl. No. 16/549,116, mailed Aug. 18, 2021, 2 pages.
Notice of Allowance and Examiner-Initiated Interview Summary for U.S. Appl. No. 16/549,116, mailed Sep. 14, 2021, 15 pages.
Non-Final Office Action for U.S. Appl. No. 17/095,204, mailed Oct. 14, 2021, 8 pages.
International Search Report and Written Opinion for International Patent Application No. PCT/US2021/047854, mailed Dec. 13, 2021, 13 pages.
Notice of Allowance for U.S. Appl. No. 17/552,497, mailed Feb. 22, 2023, 8 pages.
Notice of Allowance for U.S. Appl. No. 17/095,204, mailed Mar. 17, 2022, 7 pages.
Non-Final Office Action for U.S. Appl. No. 17/102,510, mailed Mar. 18, 2022, 12 pages.
Non-Final Office Action for U.S. Appl. No. 14/575,491, mailed May 26, 2017, 20 pages.
Non-Final Office Action for U.S. Appl. No. 14/659,379, mailed Apr. 7, 2017, 37 pages.
Author Unknown, "1-Wire," Wikipedia, last modified Jan. 16, 2015, accessed Feb. 12, 2015, http://en.wikipedia.org/wiki/1-Wire, 4 pages.
Author Unknown, "DS1822: Econo 1-Wire Digital Thermometer," Maxim Integrated, 2007, 21 pages.
Author Unknown, "Maxim 1-Wire® Tutorial," MAXIM, online audiovisual presentation, 17 slides, No Date, accessed Feb. 12, 2015, http://www.maximintegrated.com/products/1-wire/flash/overview/ (38 images of slides).
Awtry, Dan, et al., "Design Guide v1.0," Springbok Digitronics, Aug. 19, 2004, 96 pages.
Non-Final Office Action for U.S. Appl. No. 14/575,491, mailed Nov. 30, 2017, 18 pages.
Non-Final Office Action for U.S. Appl. No. 14/659,292, mailed Sep. 29, 2017, 27 pages.
Final Office Action for U.S. Appl. No. 14/659,292, mailed Apr. 30, 2018, 24 pages.
Non-Final Office Action for U.S. Appl. No. 14/659,328, mailed Sep. 8, 2017, 51 pages.
Final Office Action for U.S. Appl. No. 14/659,328, mailed Mar. 20, 2018, 61 pages.
Notice of Allowance for U.S. Appl. No. 14/659,328, mailed Jul. 2, 2018, 8 pages.
Non-Final Office Action for U.S. Appl. No. 14/659,355, mailed Sep. 20, 2017, 32 pages.
Final Office Action for U.S. Appl. No. 14/659,355, mailed Apr. 17, 2018, 11 pages.
Advisory Action for U.S. Appl. No. 14/659,355, mailed Jul. 5, 2018, 3 pages.
Non-Final Office Action for U.S. Appl. No. 15/467,790, mailed Jun. 28, 2018, 14 pages.
Ex Parte Quayle Action for U.S. Appl. No. 15/365,315, mailed Jul. 26, 2018, 7 pages.
Final Office Action for U.S. Appl. No. 14/659,379, mailed Oct. 18, 2017, 44 pages.
Advisory Action for U.S. Appl. No. 14/659,379, mailed Feb. 26, 2018, 3 pages.
Notice of Allowance for U.S. Appl. No. 14/659,379, mailed Mar. 20, 2018, 10 pages.
Non-Final Office Action for U.S. Appl. No. 14/659,371, mailed Sep. 25, 2017, 23 pages.
Final Office Action for U.S. Appl. No. 14/659,371, mailed May 3, 2018, 21 pages.
Advisory Action for U.S. Appl. No. 14/659,371, mailed Aug. 1, 2018, 3 pages.
Non-Final Office Action for U.S. Appl. No. 14/659,292, mailed Dec. 21, 2018, 23 pages.
Final Office Action for U.S. Appl. No. 14/659,292, mailed Jun. 4, 2019, 24 pages.
Non-Final Office Action for U.S. Appl. No. 14/659,355, mailed Oct. 12, 2018, 8 pages.
Final Office Action for U.S. Appl. No. 14/659,355, mailed May 2, 2019, 8 pages.
Non-Final Office Action for U.S. Appl. No. 15/886,209, mailed May 17, 2019, 7 pages.
Non-Final Office Action for U.S. Appl. No. 14/659,371, mailed Feb. 26, 2019, 22 pages.
Non-Final Office Action for U.S. Appl. No. 15/365,295, mailed Mar. 29, 2019, 15 pages.
Final Office Action for U.S. Appl. No. 15/365,295, mailed Aug. 15, 2019, 11 pages.
Final Office Action for U.S. Appl. No. 15/467,790, mailed Nov. 5, 2018, 15 pages.
Advisory Action for U.S. Appl. No. 15/467,790, mailed Feb. 26, 2019, 3 pages.
Notice of Allowance for U.S. Appl. No. 15/467,790, mailed May 20, 2019, 8 pages.
Non-Final Office Action for U.S. Appl. No. 15/443,236, mailed Nov. 16, 2018, 19 pages-.
Final Office Action for U.S. Appl. No. 15/443,236, mailed May 30, 2019, 20 pages.
Notice of Allowance and Examiner-Initiated Interview Summary for U.S. Appl. No. 15/365,315, mailed Sep. 14, 2018, 9 pages.
Notice of Allowance for U.S. Appl. No. 15/472,756, mailed Aug. 8, 2018, 8 pages.
Notice of Allowance for U.S. Appl. No. 15/886,209, mailed Sep. 11, 2019, 7 pages.
Notice of Allowance for U.S. Appl. No. 16/402,613, mailed Nov. 4, 2019, 9 pages.
Notice of Allowance for U.S. Appl. No. 16/407,397, mailed Nov. 12, 2019, 7 pages.

(56) References Cited

OTHER PUBLICATIONS

Advisory Action for U.S. Appl. No. 15/365,295, mailed Nov. 6, 2019, 3 pages.
Corrected Notice of Allowance for U.S. Appl. No. 15/467,790, mailed Aug. 15, 2019, 6 pages.
Corrected Notice of Allowance for U.S. Appl. No. 15/467,790, mailed Aug. 28, 2019, 6 pages.
Notice of Allowance for U.S. Appl. No. 15/443,236, mailed Sep. 24, 2019, 8 pages.
Notice of Allowance for U.S. Appl. No. 15/365,295, mailed Feb. 25, 2020, 8 pages.
Awtry, Dan, "Transmitting Data and Power over a One-Wire Bus," Sensors, Feb. 1997, Dallas Semiconductor, 4 pages.
Non-Final Office Action for U.S. Appl. No. 16/736,164, mailed Feb. 27, 2020, 7 pages.
Final Office Action for U.S. Appl. No. 16/736,164, mailed Jun. 2, 2020, 7 pages.
Non-Final Office Action for U.S. Appl. No. 16/736,164, mailed Sep. 21, 2020, 8 pages.
Extended European Search Report for European Patent Application No. 22208632.4, mailed May 2, 2023, 11 pages.
Extended European Search Report for European Patent Application No. 22210008.3, mailed Apr. 25, 2023, 7 pages.
Extended European Search Report for European Patent Application No. 23152712.8, mailed Apr. 24, 2023, 11 pages.
First Office Action for Chinese Patent Application No. 202080020865.8, mailed Jan. 12, 2024, 12 pages.
Examination Report for European Patent Application No. 20703620.3, mailed Dec. 12, 2023, 5 pages.
Non-Final Office Action for U.S. Appl. No. 18/154,127, mailed Apr. 15, 2024, 21 pages.

* cited by examiner

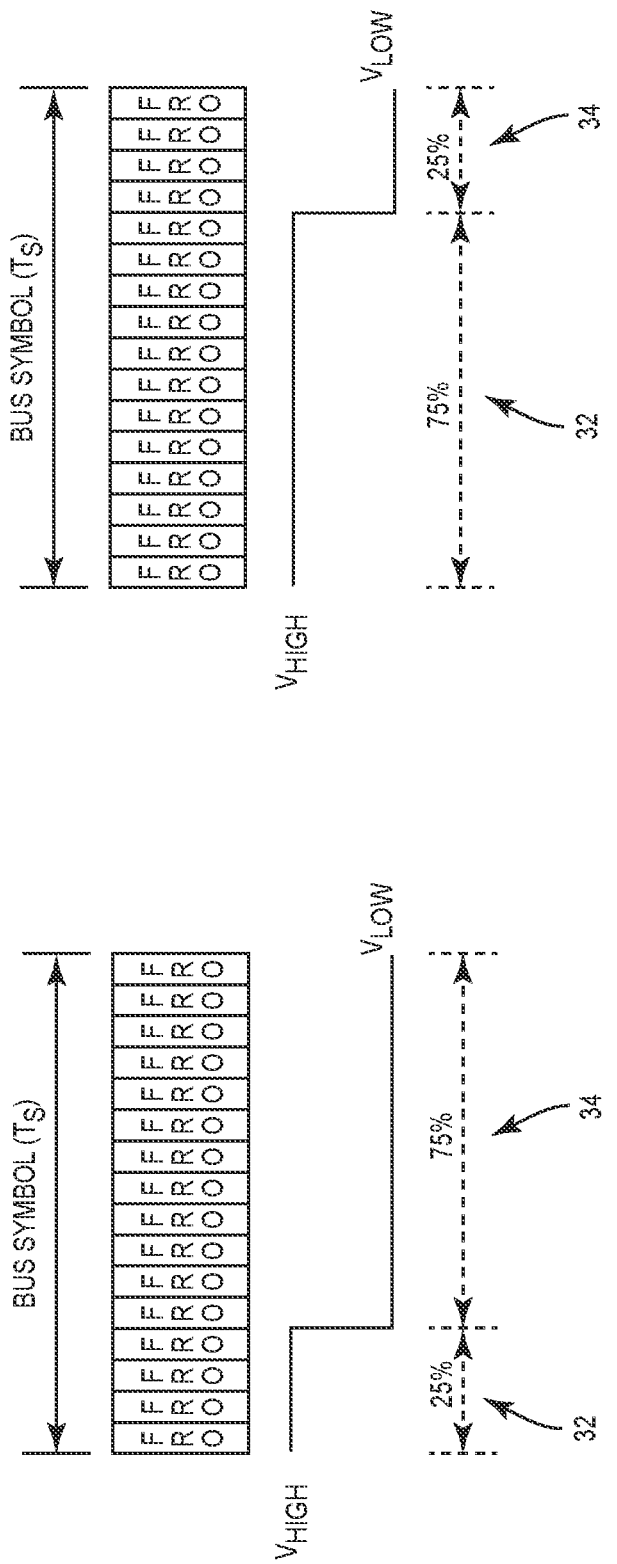

SCAN TEST IN A SINGLE-WIRE BUS CIRCUIT

FIELD OF THE DISCLOSURE

The technology of the disclosure relates generally to performing a Scan test in a single-wire bus circuit exposing only one physical pin.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Today's mobile communication devices can include numerous logic devices. As the logic devices become increasingly complex, it will take tremendous amounts of time and effort to manually create, execute, and validate the logic devices based on traditional testing methods (a.k.a., functional tests). Further, the functional tests can only exercise expected modes of operation on certain parts, as opposed to exercising all possible modes of operation on all parts in the logic devices. Those unexercised modes of operation on those untested parts can become problematic when the untested parts are made to operate in an unexpected mode(s), or with undetected flows that cause the untested parts to behave intermittently or draw excess supply current. To overcome deficiency of the traditional testing methods, a design for test (DFT) approach, wherein an integrated circuit (IC) design is modified to accommodate structural tests (a.k.a., Scan test), has been widely adopted by the IC industry nowadays.

A Scan test is a well-known method that involves scanning test patterns into internal circuits within the logic devices under test. FIG. 1 is a schematic diagram of an exemplary circuit 10 configured to perform a Scan test on a combinational logic 12. The circuit 10 includes one or more register circuits 14 (e.g., flip-flop circuits) that are coupled to the combinational logic 12 via one or more two-to-one multiplexers 16.

In a normal operation, the combinational logic 12 receives one or more digital inputs 18 and outputs one or more digital outputs 20. The multiplexer 16 in front of each of the register circuits 14 takes a respective one of the digital inputs 18 from the combinational logic 12. Notably, the input to the multiplexer 16 is usually an arbitrary logic gate (not shown) output within the combinational logic 12 and is not necessarily the digital input 18. Each of the register circuits 14 drives the combinational logic 12 to output a respective one of the digital outputs 20. The output of the register circuits 14 is usually an input to a logic gate (not shown) within the combinational logic 12 and not necessarily the digital output 20.

In Scan test mode, the multiplexers 16 are switched so that the register circuits 14 operate as large shift registers. To perform the Scan test, a known data pattern is first loaded into the register circuits 14 via a Scan input (SI) pin in accordance with a clock (CLK) signal (not shown) received via a CLK pin. Once the data pattern is loaded into the register circuits 14, then a Scan enable (SE) is set on an SE pin to switch the multiplexers 16 out of the Scan test mode and back to operational mode to thereby propagate the data residing in the register circuits 14 through the combinational logic 12. After the logic states have settled, then the SE toggles the multiplexers 16 back to the Scan test mode and the data is clocked out of the register circuits 14 via a Scan output (SO) pin. In this regard, it would require a minimum of four (4) physical pins, namely the SI pin, the SE pin, the CLK pin, and the SO pin, to enable the Scan test in the circuit 10.

SUMMARY

Aspects disclosed in the detailed description are related to a Scan test in a single-wire bus circuit. Specifically, the single-wire bus circuit has only one external pin for connecting to a single-wire bus. Given that multiple physical pins, namely a Scan input (SI) pin, a Scan enable (SE) pin, a clock (CLK) pin, and a Scan output (SO) pin, are required to carry out the Scan test, the single-wire bus circuit must provide additional pins required by the Scan test. In embodiments disclosed herein, the single-wire bus circuit includes a communication circuit under test, and a driver circuit coupled to the communication circuit via multiple internal pins. The driver circuit uses a subset of the internal pins as input pins (e.g., SI, SE, and CLK pins) and another subset of the internal pins as output pins (e.g., SO pins) to carry out the Scan test in the communication circuit. As a result, it is possible to perform the Scan test without adding additional external pins to the single-wire bus circuit, thus helping to reduce complexity and footprint of the single-wire bus circuit.

In one aspect, a single-wire bus circuit is provided. The single-wire bus circuit includes a bus pin coupled to a single-wire bus. The single-wire bus circuit also includes a communication circuit coupled to the bus pin. The single-wire bus circuit also includes a driver circuit coupled to the bus pin. The driver circuit includes multiple test pins coupled to the communication circuit. The driver circuit also includes a test driver circuit. The test driver circuit is configured to operate in a test mode in each of multiple test cycles to provide one or more test input values to a first subset of the multiple test pins to thereby cause a test to be performed in the communication circuit. The test driver circuit is also configured to operate in a test mode in each of the multiple test cycles to receive one or more test output values resulting from the test performed in the communication circuit via a second subset of the multiple test pins.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 2B is a schematic diagram providing an exemplary illustration of a voltage pulse-width modulation (PWM) value representing a binary zero ("0");

FIG. 2C is a schematic diagram providing an exemplary illustration of a voltage PWM value representing a binary one ("1");

DETAILED DESCRIPTION

Figure 1:
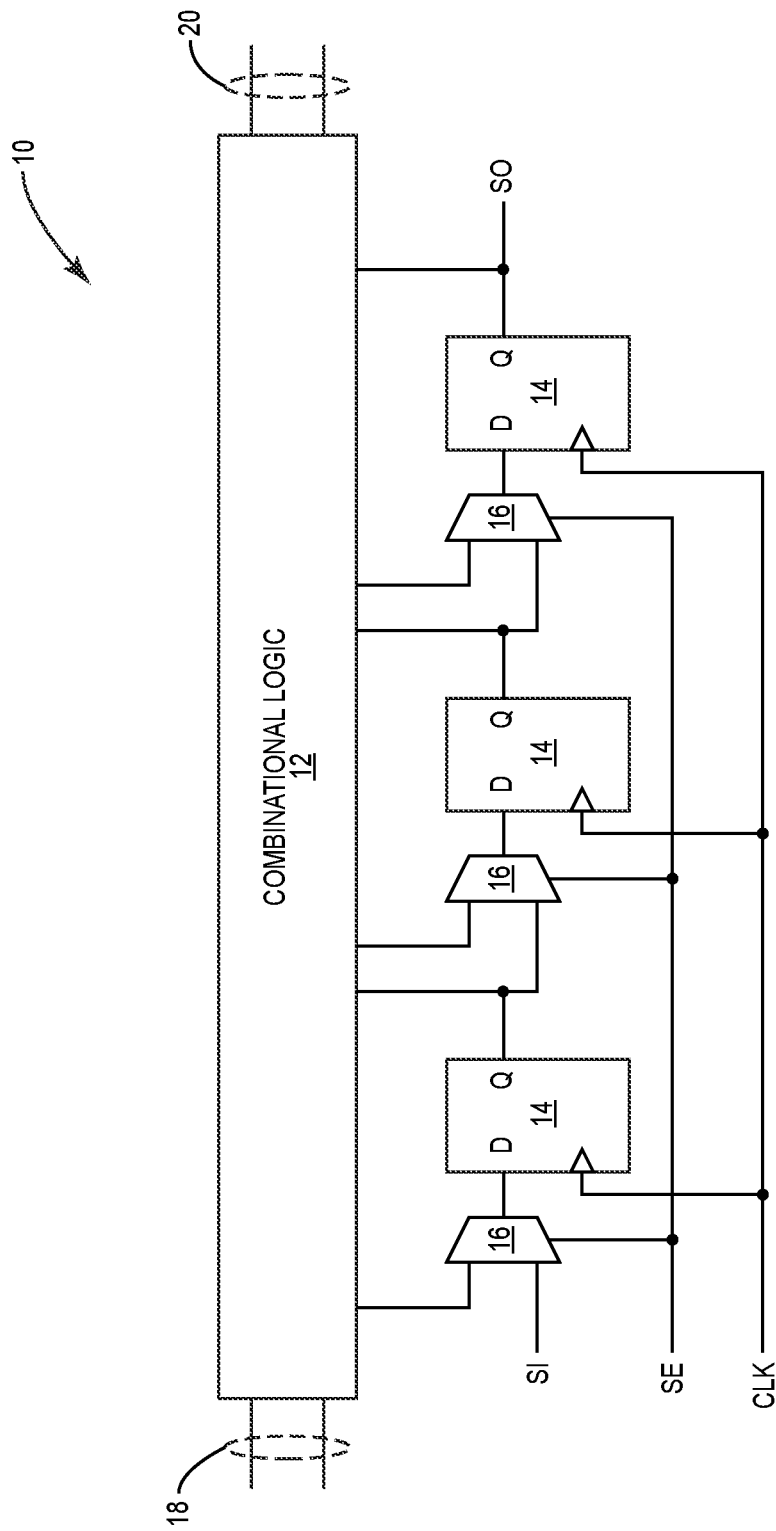
FIG. 1 is a schematic diagram of an exemplary circuit configured to perform a Scan test on a combinational logic.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description are related to a Scan test in a single-wire bus circuit. Specifically, the single-wire bus circuit has only one external pin for connecting to a single-wire bus. Given that multiple physical pins, namely a Scan input (SI) pin, a Scan enable (SE) pin, a clock (CLK) pin, and a Scan output (SO) pin, are required to carry out the Scan test, the single-wire bus circuit must provide additional pins required by the Scan test. In embodiments disclosed herein, the single-wire bus circuit includes a communication circuit under test, and a driver circuit coupled to the communication circuit via multiple internal pins. The driver circuit uses a subset of the internal pins as input pins (e.g., SI, SE, and CLK pins) and another subset of the internal pins as output pins (e.g., SO pins) to carry out the Scan test in the communication circuit. As a result, it is possible to perform the Scan test without adding additional external pins to the single-wire bus circuit, thus helping to reduce complexity and footprint of the single-wire bus circuit.

Figure 2A:
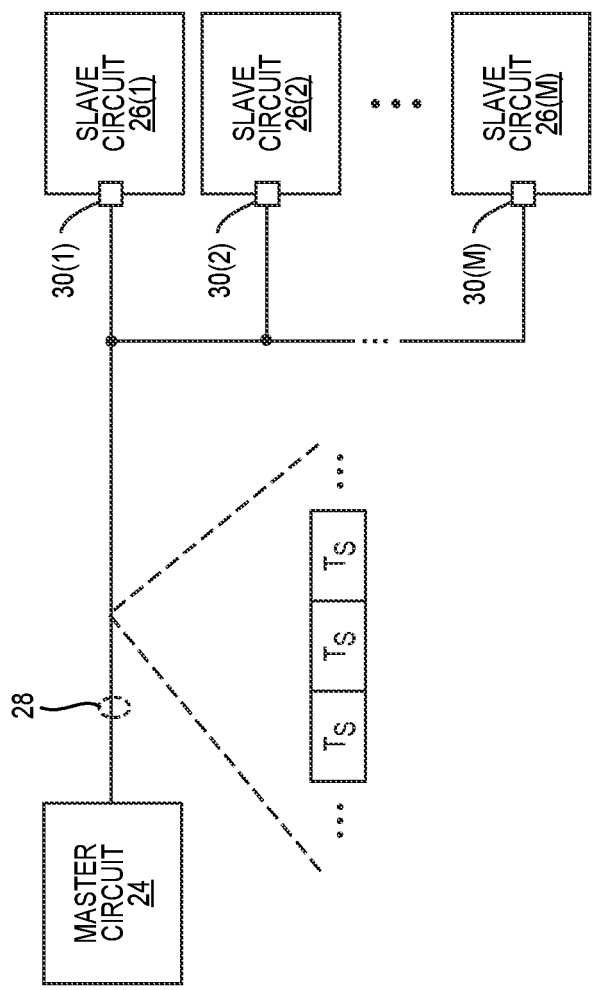
FIG. 2A is a schematic diagram of an exemplary single-wire bus apparatus in which a master circuit is configured to communicate with a slave circuit(s) over a single-wire bus consisting of a single wire.
Figure 3:
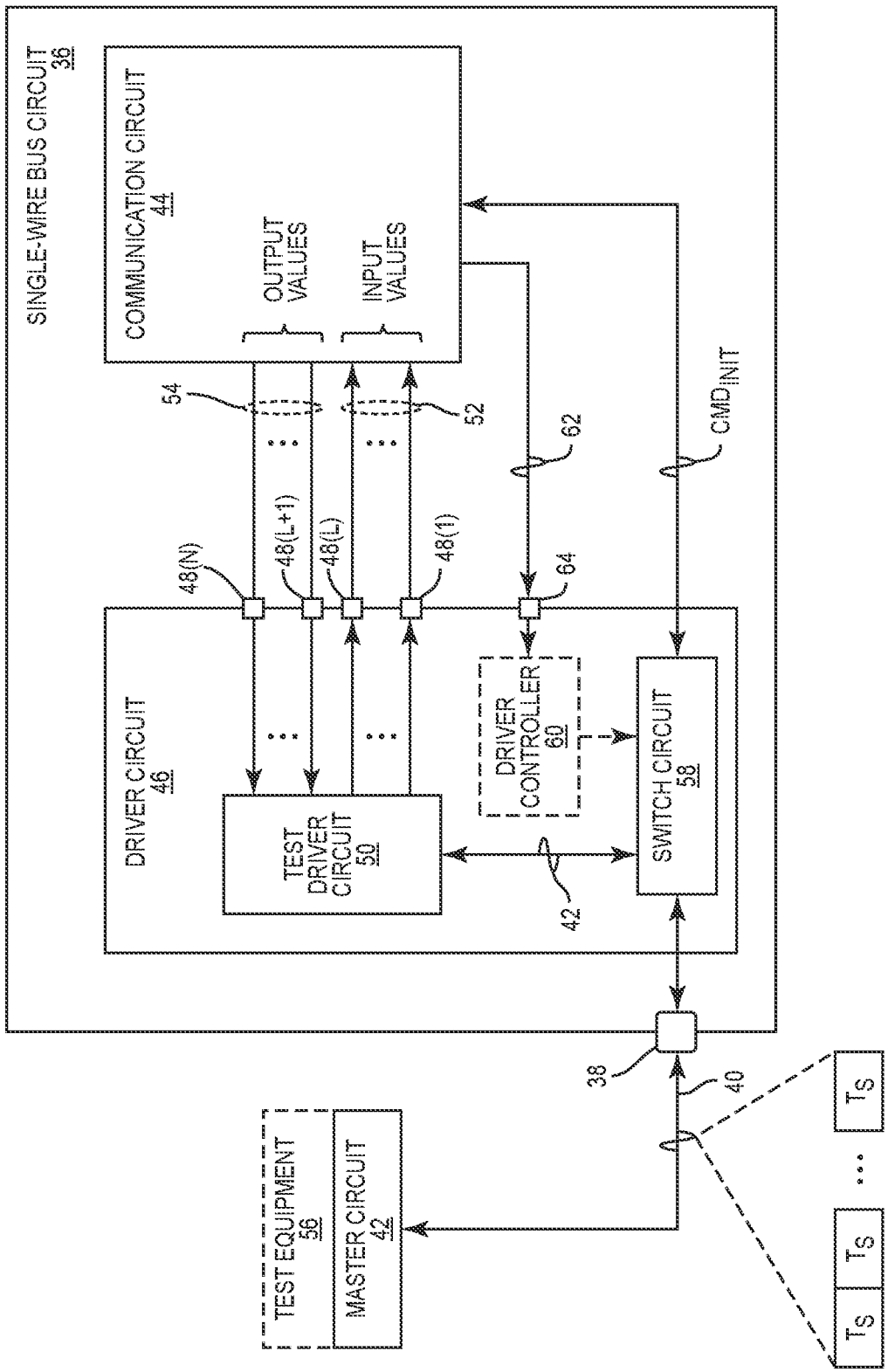
FIG. 3 is a schematic diagram of an exemplary single-wire bus circuit that can be adapted according to various embodiments of the present disclosure to enable a Scan test despite that the single-wire bus circuit only exposes a bus pin for external access via a single-wire bus.

Before discussing performing a Scan test in a single-wire bus circuit of the present disclosure, starting at FIG. 3, a brief overview of a single-wire bus apparatus is first provided with reference to FIGS. 2A-2C to help understand basic operations of the single-wire bus.

In this regard, FIG. 2A is a schematic diagram of an exemplary single-wire bus apparatus 22 in which a master circuit 24 is configured to communicate with a number of slave circuits 26(1)-26(M) over a single-wire bus 28 consisting of a single wire. Each of the slave circuits 26(1)-26(M) is coupled to the single-wire bus 28 via a respective one of multiple bus pins 30(1)-30(M). Notably, the bus pins 30(1)-30(M) are the only physical pins exposed by the slave circuit 26(1)-26(M) for external access.

The master circuit 24 is configured to always initiate a bus telegram communication over the single-wire bus 28 by communicating a bus telegram(s) to one or more of the slave circuits 26(1)-26(M). As such, the single-wire bus apparatus 22 is also known as a "master-slave bus architecture." The slave circuits 26(1)-26(M) may provide a data payload(s) to the master circuit 24 over the single-wire bus 28 in response to receiving the bus telegram(s) from the master circuit 24.

The bus telegram(s) and the data payload(s) are communicated between the master circuit 24 and the slave circuits 26(1)-26(M) based on a series of bus symbols $T_S$ conveyed sequentially over the single-wire bus 28. Some of the bus symbols $T_S$ are used exclusively for one-way communication from the master circuit 24 to the slave circuits 26(1)-26(M) (also referred to as "write data symbols"), while some other bus symbols $T_S$ can be shared for two-way communication between the master circuit 24 and the slave circuits 26(1)-26(M) (also referred to as "read data symbols"). For a detailed description on how the master circuit 24 and the slave circuits 26(1)-26(M) can conduct one-way or two-way communication in the bus symbols $T_S$, please refer to U.S. patent application Ser. No. 17/102,510, now U.S. Pat. No. 11,489,695, entitled "FULL-DUPLEX COMMUNICATIONS OVER A SINGLE-WIRE BUS" (hereinafter referred to as "APP510").

Each of the bus symbols $T_S$ can be pulse-width modulated to represent a binary zero ("0") or a binary one ("1"), as illustrated in FIGS. 2B and 2C, respectively. FIG. 2B is a schematic diagram providing an exemplary illustration of a voltage pulse-width modulation (PWM) value representing a binary "0".

The bus symbol $T_S$ is modulated based on a predefined high-voltage interval 32 and a predefined low-voltage interval 34 that are configured according to a predefined duty cycle. To represent the binary "0," the predefined high-voltage interval 32 is shorter than the predefined low-voltage interval 34. For example, the bus symbol $T_S$ can include sixteen (16) free-running oscillators (FROs) or 16 digitally controlled oscillators (DCOs). To represent the binary "0," the predefined high-voltage interval 32 is configured to last for the first four (4) FROs or DCOs (25%) and the predefined low-voltage interval 34 is configured to last for the remaining twelve (12) FROs or DCOs (75%). Accordingly, the predefined duty cycle is said to be 25%. In this regard, to modulate the bus symbol $T_S$ to represent the binary "0," a higher bus voltage $V_{HIGH}$ is first asserted on the single-wire bus 28 for 25% duration of the bus symbol $T_S$ and then a lower bus voltage $V_{LOW}$ is asserted on the single-wire bus 28 for 75% duration of the bus symbol $T_S$. Notably, the bus symbol $T_S$ can also be modulated to represent the binary "0" by configuring the predefined low-voltage interval 34 to last for the first 12 FROs or DCOs (75%) and the predefined high-voltage interval 32 to last for the remaining 4 FROs or DCOs (25%).

FIG. 2C is a schematic diagram providing an exemplary illustration of a voltage PWM value representing a binary "1". Common elements between FIGS. 2B and 2C are shown therein with common element numbers and will not be re-described herein.

To represent the binary "1," the predefined high-voltage interval 32 is longer than the predefined low-voltage interval 34. Based on the same example in FIG. 2B, the predefined high-voltage interval 32 lasts for the first 12 FROs or DCOs (75%) and the predefined low-voltage interval 34 lasts for the remaining 4 FROs or DCOs (25%). Accordingly, the predefined duty cycle is said to be 75%. In this regard, to modulate the bus symbol $T_S$ to represent the binary "1," a higher bus voltage $V_{HIGH}$ is first asserted on the single-wire bus 28 for 75% of the duration of the bus symbol $T_S$ and then a lower bus voltage $V_{LOW}$ is asserted on the single-wire bus 28 for 25% of the duration of the bus symbol $T_S$. Notably, the bus symbol $T_S$ can also be modulated to represent the binary "1" by configuring the predefined low-voltage interval 34 to last for the first 4 FROs or DCOs (25%) and the predefined high-voltage interval 32 to last for the remaining 12 FROs or DCOs (75%).

It should be appreciated from the discussion in FIGS. 2B and 2C that the bus symbol $T_S$ can also be modulated based on other duty cycles. For example, to modulate the bus symbol $T_S$ based on a 50% duty cycle, a higher bus voltage $V_{HIGH}$ and a lower bus voltage $V_{LOW}$ would each be asserted on the single-wire bus 28 for 50% duration of the bus symbol $T_S$.

Embodiments of the present disclosure are now discussed with reference to FIGS. 3 to 6. FIG. 3 is a schematic diagram of an exemplary single-wire bus circuit 36 that can be adapted according to various embodiments of the present disclosure to enable a Scan test despite that the single-wire bus circuit 36 only exposes a bus pin 38 for external access via a single-wire bus 40. In a non-limiting example, the single-wire bus circuit 36 can be functionally equivalent to any of the slave circuits 26(1)-26(M) in FIG. 2A. In this regard, the single-wire bus circuit 36 can communicate with a master circuit 42, such as the master circuit 24 in FIG. 2A, in multiple bus symbols $T_S$ based on the full-duplex communications scheme described in APP510. Similar to the bus symbols $T_S$ in FIG. 2A, each of the bus symbols $T_S$ can also be pulse-width modulated to carry a binary "0" or a binary "1."

The single-wire bus circuit 36 includes a communication circuit 44 that is under test. The single-wire bus circuit 36 further includes a driver circuit 46 to provide multiple test pins 48(1)-48(N) for enabling a test (e.g., Scan test) in the communication circuit 44. The test pins 48(1)-48(N) can be divided into a first subset of test pins 48(1)-48(L) and a second set of test pins 48(L+1)-48(N) (L<N). In a non-limiting example, the first subset of the test pins 48(1)-48(L) is used as input pins to provide test inputs to the communication circuit 44, and the second subset of test pins 48(L+1)-48(N) is used as output pins to receive test results from the communication circuit 44. In an embodiment, the driver circuit 46 includes a test driver circuit 50 configured to bridge the bus pin 38 with the test pins 48(1)-48(N).

The single-wire bus circuit 36 can be configured to operate in a test mode to conduct the test in the communication circuit 44 or in a communication mode to carry out normal communications with the master circuit 42. When operating in the communication mode, the communication circuit 44 is coupled to the bus pin 38 to communicate with the master circuit 42 based on the full-duplex bus communications scheme described in APP510. In the meantime, the test driver circuit 50 is decoupled from the bus pin 38.

When operating in the test mode, the test driver circuit 50 is coupled to the bus pin 38 and the communication circuit 44 is decoupled from the bus pin 38. Accordingly, the test driver circuit 50 receives one or more test input values 52 (e.g., SI and SE) from the master circuit 42 and transmits one or more test output values 54 (e.g., SO) to the master circuit 42.

In an embodiment, the master circuit 42 may be replaced by a test equipment 56 or configured to act as the test equipment 56 to conduct the test in the communication circuit 44 in the test mode. Regardless of how the test equipment 56 is provided, the test equipment 56 is configured to communicate with the test driver circuit 50 based on the full-duplex communications scheme described in APP510.

The test driver circuit 50 is configured to provide the test input values 52 to the communication circuit 44 via the first subset of the test pins 48(1)-48(L) to thereby cause the test to be performed in the communication circuit 44. During the test mode, the test driver circuit 50 also receives the test output values 54 resulting from the test performed in the communication circuit 44 via the second subset of the test pins 48(L+1)-48(N). In an embodiment, the test driver circuit 50 is configured to provide the test input values 52 to the communication circuit 44 and receive the test output values 54 from the communication circuit 44 concurrently.

By bridging the external bus pin 38 with the internal test pins 48(1)-48(N) using the driver circuit 46, it is possible to carry out a Scan test in the communication circuit 44 without adding additional external pins to the single-wire bus circuit 36. As a result, it is possible to test the communication circuit 44 thoroughly to ensure reliability of the single-wire bus circuit 36, without increasing complexity and footprint of the single-wire bus circuit 36.

To toggle the single-wire bus circuit 36 between the test mode and the communication mode, the driver circuit 46 also includes a switch circuit 58. The switch circuit 58 is coupled between the bus pin 38, the test driver circuit 50, and the communication circuit 44. The switch circuit 58 may be controlled to couple or decouple any of the test driver circuit 50 and the communication circuit 44 to or from the bus pin 38.

In an embodiment, the switch circuit 58 may be controlled by a driver controller 60. In a non-limiting example, the driver controller 60 can receive an explicit indication 62 via a test mode (TM) pin 64. The explicit indication 62 may be provided by asserting or de-asserting a voltage on the TM pin 64. For example, the voltage can be increased above a threshold (a.k.a. asserted) to indicate the test mode or decreased below the threshold (a.k.a., de-asserted) to indicate the communication mode, or vice versa.

The single-wire bus circuit 36 may automatically engage in the communication mode when the single-wire bus circuit 36 is powered up. In this regard, the explicit indication 62 will be automatically de-asserted each time the single-wire bus circuit 36 is power cycled or reset. In contrast, the explicit indication 62 has to be deliberately asserted to engage the single-wire bus circuit 36 in the test mode. In a non-limiting example, during the communication mode, the master circuit 42 can communicate a test initiation command $CMD_{INIT}$ to the communication circuit 44 in a bus telegram(s) to instruct the communication circuit 44 to switch from the communication mode to the test mode. Accordingly, the communication circuit 44 can assert the explicit indication 62 to cause the test driver circuit 50 to enter the test mode.

In response to receiving the explicit indication 62 that indicates the test mode, the driver controller 60 controls the switch circuit 58 to couple the test driver circuit 50 to the bus pin 38 and decouple the communication circuit 44 from the bus pin 38. In contrast, in response to receiving the explicit indication 62 that indicates the communication mode, the driver controller 60 controls the switch circuit 58 to decouple the test driver circuit 50 from the bus pin 38 and couple the communication circuit 44 to the bus pin 38.

Figure 4:
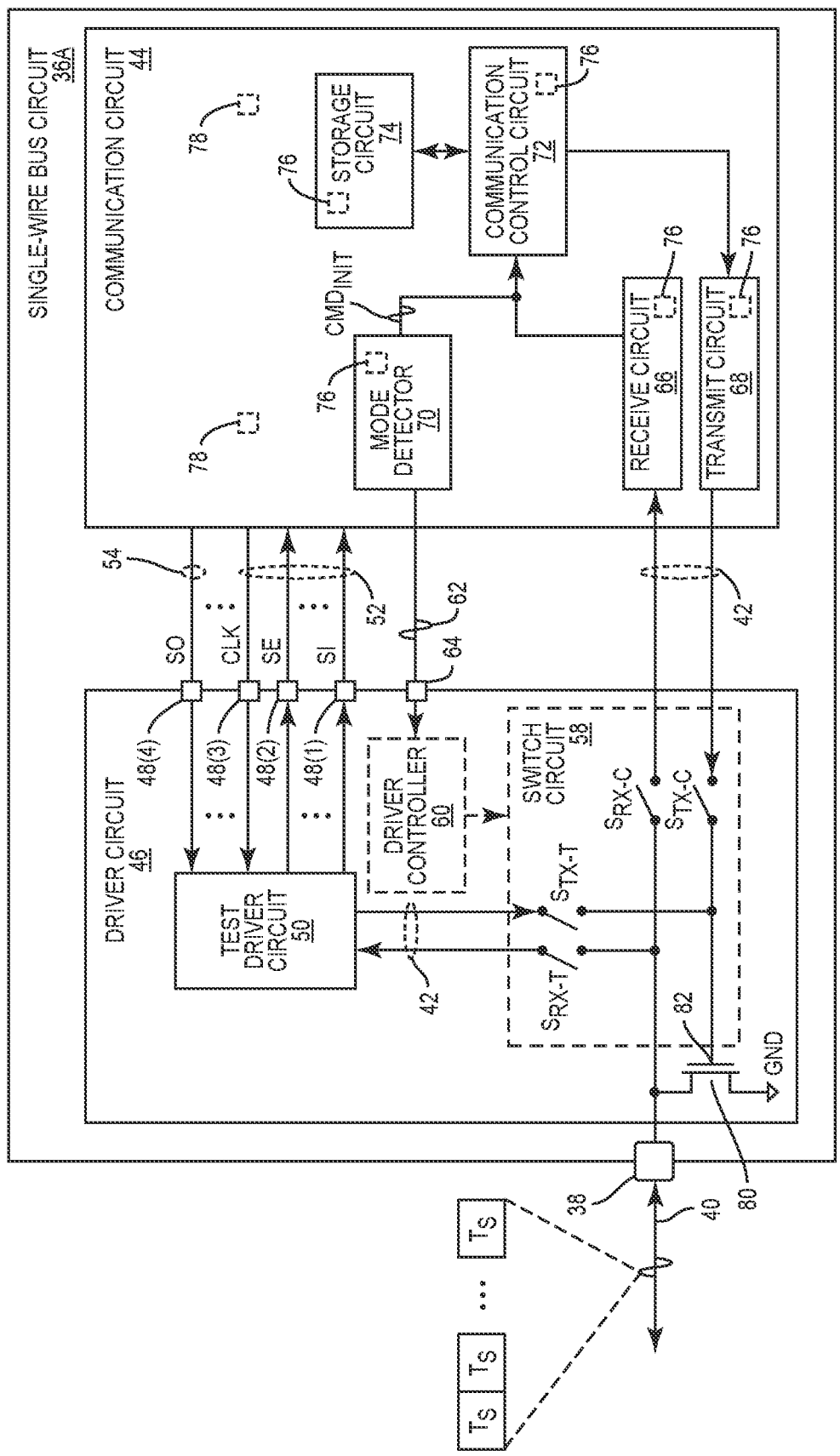
FIG. 4 is a schematic diagram of an exemplary single-wire bus circuit, which is adapted from the single-wire bus circuit of FIG. 3 according to an embodiment of the present disclosure to support the Scan test.

The single-wire bus circuit 36 can be adapted to support the Scan test, as described in FIG. 1, by configuring some or all of the test pins 48(1)-48(N) to function as the SI pin, the SE pin, the CLK pin, and the SO pin. In this regard, FIG. 4 is a schematic diagram of an exemplary single-wire bus circuit 36A, which is adapted from the single-wire bus circuit 36 of FIG. 3 according to an embodiment of the present disclosure to support the Scan test. Common elements between FIGS. 3 and 4 are shown therein with common element numbers and will not be re-described herein.

In this embodiment, the driver circuit 46 is configured to include the test pins 48(1)-48(4) from the test pins 48(1)-48(N) (N≥4) in FIG. 3. Specifically, the test pins 48(1)-48(3) are configured to function as an SI pin, an SE pin, and a CLK pin, respectively, and the test pin 48(4) is configured to function as an SO pin. In this regard, the test pins 48(1)-48(3) constitute the first subset of the test pins 48(1)-48(L) in FIG. 3, and the test pin 48(4) constitutes the second subset of the test pins 48(L+1)-48(N) in FIG. 3. Although the driver circuit 46 is shown to include only the test pins 48(1)-48(4), it should be appreciated that the driver circuit 46 can include additional spare test pins that are unused for the Scan test.

When operating in the test mode, the test driver circuit 50 provides an SI value (denoted as "SI"), an SE value (denoted as "SE"), and a CLK value (denoted as "CLK") to the SI pin 48(1), the SE pin 48(2), and the CLK pin 48(3), respectively, to thereby cause the Scan test to be performed in the communication circuit 44. The test driver circuit 50 also receives an SO value (denoted as "SO"), which indicates a result of the Scan test performed in the communication circuit 44, via the SO pin 48(4). In this embodiment, each of the SI value, the SE value, and the SO value is pulse-width modulated to represent a binary "0" or a binary "1," as previously illustrated in FIGS. 2B and 2C, respectively.

According to the previous discussion in FIG. 4, the test driver circuit 50 is configured to operate as a bridge between the bus pin 38 and the test pins 48(1)-48(4). In one aspect, the test driver circuit 50 needs to communicate the SI value, the SE value, the CLK value, and the SO value with the communication circuit 44 in parallel via the test pins 48(1)-48(4). In another aspect, the test driver circuit 50 also needs to communicate the SI value, the SE value, and the SO value with the test equipment 56 in the bus symbols $T_S$, which are only conveyed in serial over the single-wire bus 40. In this regard, the test driver circuit 50 would need to provide a serial-to-parallel conversion between the bus pin 38 and the test pins 48(1)-48(4). This may be done by dividing and grouping the bus symbols $T_S$ into multiple test cycles, as discussed in detail in FIGS. 5 and 6 below.

Figure 5:
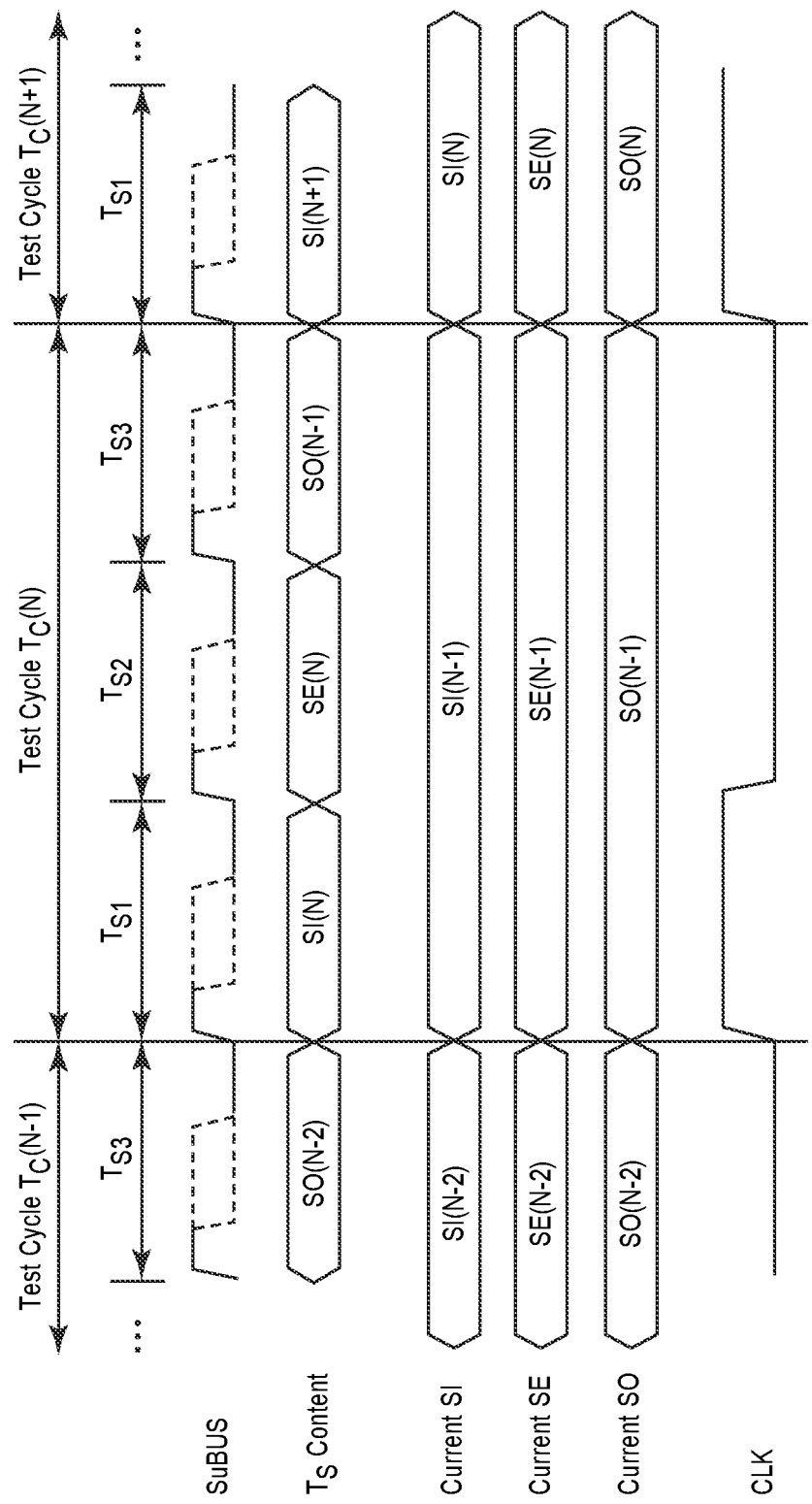
FIG. 5 is a graphic diagram providing an exemplary illustration of the Scan test performed by the single-wire bus circuit of FIG. 4 in accordance with one embodiment of the present disclosure.

FIG. 5 of is a graphic diagram providing an exemplary illustration of the Scan test performed by the single-wire bus circuit 36A of FIG. 4 in accordance with one embodiment of the present disclosure. Common elements between FIGS. 4 and 5 are shown therein with common element numbers and will not be re-described herein.

FIG. 5 illustrates three consecutive test cycles $T_C(N-1)$, $T_C(N)$, $T_C(N+1)$ as a non-limiting example. Among them, the test cycle $T_C(N-1)$ is referred to as "an immediately preceding test cycle" to the test cycle $T_C(N)$, and the test cycle $T_C(N+1)$ is referred to as "an immediately succeeding test cycle" to the test cycle $T_C(N)$. In this embodiment, each of the test cycles $T_C(N-1)$, $T_C(N)$, $T_C(N+1)$ includes a first bus symbol $T_{S1}$, a second bus symbol $T_{S2}$, and a third bus symbol $T_{S3}$, which are consecutive bus symbols among the test symbols $T_S$ communicated over the single-wire bus 40.

In a non-limiting example, in each of the test cycles $T_C(N-1)$, $T_C(N)$, $T_C(N+1)$, the test driver circuit 50 is configured to receive the SI value in the first bus symbol $T_{S1}$, receive the SE value in the second bus symbol $T_{S2}$, and transmit the SO value in the third bus symbol $T_{S3}$. Understandably, the first bus symbol $T_{S1}$, the second bus symbol $T_{S2}$, and the third bus symbol $T_{S3}$ are each pulse-width modulated to represent the binary "0" or the binary "1" based on previous examples shown in FIGS. 2B and 2C, respectively. The test driver circuit 50 is further configured to derive the CLK value on the third bus symbol $T_{S3}$, which is the last bus symbol in each of the test cycles $T_C(N-1)$, $T_C(N)$, $T_C(N+1)$. It should be appreciated that the SI value, the SE value, and the SO value can be communicated in any order in each of the test cycles $T_C(N-1)$, $T_C(N)$, $T_C(N+1)$, without changing the operating principle described herein.

During the test cycle $T_C(N)$, the SI value (denoted as "SI(N−1)"), the SE value (denoted as "SE(N−1)"), and the SO value (denoted as "SO(N−1)") available on the SI pin 48(1), the SE pin 48(2), and the SO pin 48(4) were actually set in the immediately preceding test cycle $T_C(N-1)$. In this regard, the SO value transmitted to the test equipment 56 in the third bus symbol $T_{S3}$ is the SO value SO(N−1) generated in the immediately preceding test cycle $T_C(N-1)$.

During the test cycle $T_C(N)$, the test driver circuit 50 receives the SI value (denoted as "SI(N)") in the first bus symbol $T_{S1}$ and the SE value (denoted as "SE(N)") in the second bus symbol $T_{S2}$. Notably, the SI value SI(N) and the SE value SE(N) received during the test cycle $T_C(N)$ are to be applied to the SI pin 48(1) and the SE pin 48(2) in the immediately succeeding test cycle $T_C(N+1)$. Similarly, the SO value (denoted as "SO(N)") generated during the test cycle $T_C(N)$ is only accessible on the SO pin 48(4) in the immediately succeeding test cycle $T_C(N+1)$.

From the example above, it is apparent that there exists one test cycle delay between the bus pin 38 and the test pins 48(1)-48(4). Understandably, the delay is a result of the serial-to-parallel conversion performed by the test driver circuit 50.

Figure 6:
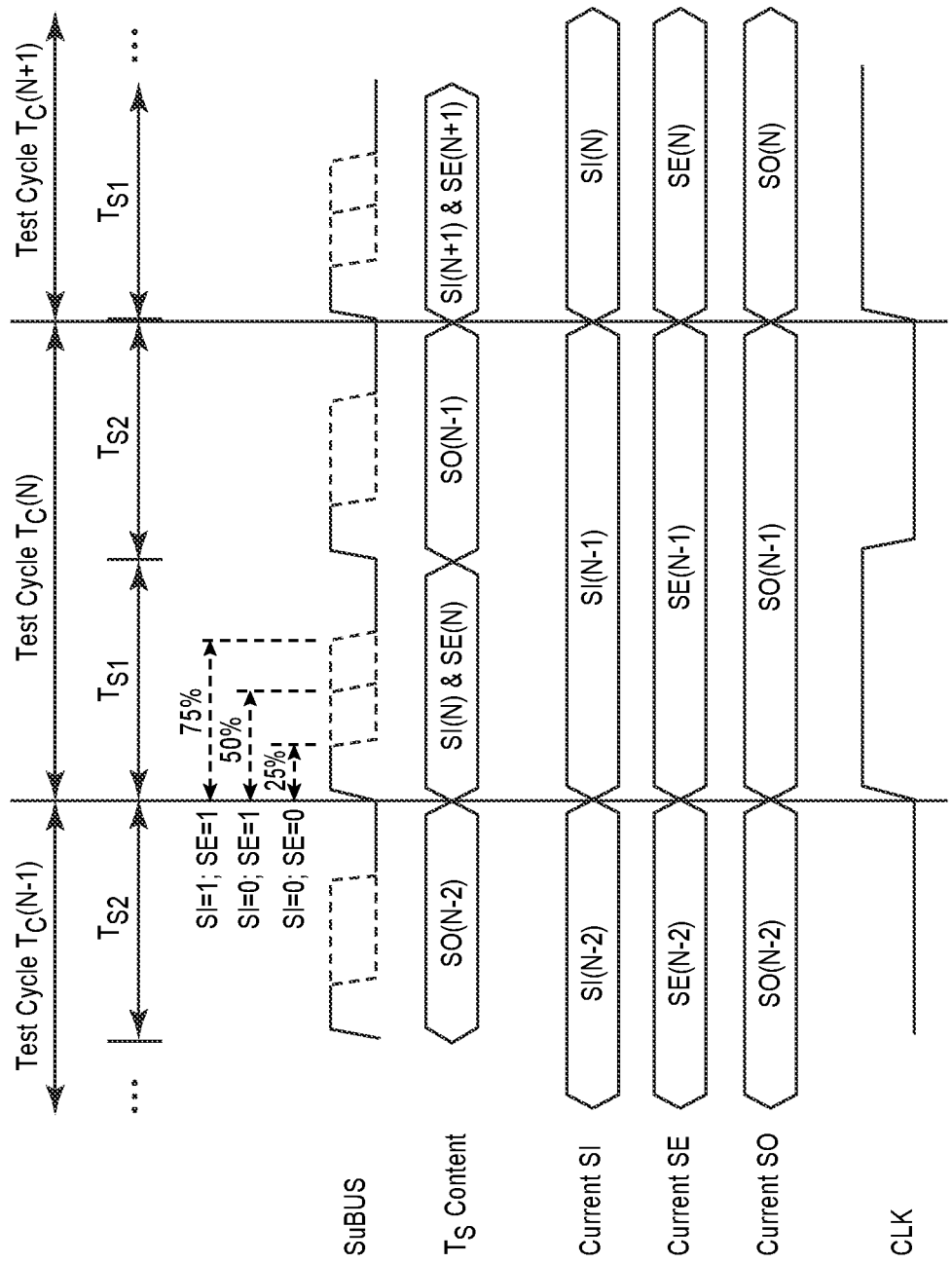
FIG. 6 is a graphic diagram providing an exemplary illustration of the Scan test performed by the single-wire bus circuit of FIG. 4 in accordance with an alternative embodiment of the present disclosure.

FIG. 6 of is a graphic diagram providing an exemplary illustration of the Scan test performed by the single-wire bus circuit 36A of FIG. 4 in accordance with another embodiment of the present disclosure. Common elements between FIGS. 4 and 6 are shown therein with common element numbers and will not be re-described herein.

FIG. 6 illustrates three consecutive test cycles $T_C(N-1)$, $T_C(N)$, and $T_C(N+1)$ as a non-limiting example. Among them, the test cycle $T_C(N-1)$ is referred to as "an immediately preceding test cycle" to the test cycle $T_C(N)$, and the test cycle $T_C(N+1)$ is referred to as "an immediately succeeding test cycle" to the test cycle $T_C(N)$. In this embodiment, each of the test cycles $T_C(N-1)$, $T_C(N)$, $T_C(N+1)$ includes a first bus symbol $T_{S1}$ and a second bus symbol $T_{S2}$, which are consecutive bus symbols among the test symbols $T_S$ communicated over the single-wire bus 40.

In a non-limiting example, in each of the test cycles $T_C(N-1)$, $T_C(N)$, $T_C(N+1)$, the test driver circuit 50 is configured to receive the SI value and the SE value in the first bus symbol $T_{S1}$ and transmit the SO value in the second bus symbol $T_{S2}$. Understandably, the first bus symbol $T_{S1}$ and the second bus symbol $T_{S2}$ are each pulse-width modulated to represent the binary "0" or the binary "1" based on previous examples shown in FIGS. 2B and 2C, respectively. The test driver circuit 50 is further configured to derive the CLK value on the second bus symbol $T_{S2}$, which is the last bus symbol in each of the test cycles $T_C(N-1)$, $T_C(N)$, $T_C(N+1)$.

In a non-limiting example, the SI value and the SE value can be represented in the first bus symbol $T_{S1}$ based on different PWM duty cycles, as shown in the table below.

| PWM Duty Cycle | SI | SE |
|---|---|---|
| 25% | "0" | "0" |
| 50% | "0" | "1" |
| 75% | "1" | "1" |

During the test cycle $T_C(N)$, the SI value (denoted as "SI(N−1)"), the SE value (denoted as "SE(N−1)"), and the SO value (denoted as "SO(N−1)") available on the SI pin 48(1), the SE pin 48(2), and the SO pin 48(4) were actually set in the immediately preceding test cycle $T_C(N-1)$. In this regard, the SO value transmitted to the test equipment 56 in the second bus symbol $T_{S2}$ is the SO value SO(N−1) generated in the immediately preceding test cycle $T_C(N-1)$.

During the test cycle $T_C(N)$, the test driver circuit 50 receives the SI value (denoted as "SI(N)") and the SE value (denoted as "SE(N)") in the first bus symbol $T_{S1}$. Notably, the SI value SI(N) and the SE value SE(N) received during the test cycle $T_C(N)$ are to be applied to the SI pin 48(1) and the SE pin 48(2) in the immediately succeeding test cycle $T_C(N+1)$. Similarly, the SO value (denoted as "SO(N)") generated during the test cycle $T_C(N)$ is only accessible on the SO pin 48(4) in the immediately succeeding test cycle $T_C(N+1)$.

With reference back to FIG. 4, the communication circuit 44 includes a receive circuit 66, a transmit circuit 68, a mode detector 70, a communication control circuit 72, and a storage circuit 74. Each of the receive circuit 66, the transmit circuit 68, the mode detector 70, the communication control circuit 72, and the storage circuit 74 may have an embedded register circuit 76 (e.g., flip flop circuit) that can be configured to perform the Scan test. In addition to the embedded register circuit 76, the communication circuit 44 may also include one or more redundant register circuits 78 that may be utilized for the Scan test as well.

The driver circuit 46 includes a current sink 80, which can be an N-type transistor for example. The current sink 80 is coupled between the bus pin 38 and a ground (GND). The switch circuit 58 includes a communication transmit switch $S_{TX-C}$, a communication receive switch $S_{RX-C}$, a test transmit switch $S_{TX-T}$, and a test receive switch $S_{RX-T}$. The communication receive switch $S_{RX-C}$ is coupled between the receive circuit 66 and the bus pin 38 and the communication transmit switch $S_{TX-C}$ is coupled between the transmit circuit 68 and an input 82 (e.g., a gate electrode of the N-type transistor) of the current sink. The test receive switch $S_{RX-T}$ is coupled between the test driver circuit 50 and the bus pin 38 and the test transmit switch $S_{TX-T}$ is coupled between the test driver circuit 50 and the input 82 of the current sink.

When operating in the communication mode, the driver controller 60 will open both the test transmit switch $S_{TX-T}$ and the test receive switch $S_{RX-T}$ to decouple the test driver circuit 50 from the bus pin 38. The driver controller 60 closes the communication receive switch $S_{RX-C}$ and opens the communication transmit switch $S_{TX-C}$ such that the receive circuit 66 can receive the data write telegrams from the master circuit 42. The driver controller 60 opens the communication receive switch $S_{RX-C}$ and closes the communication transmit switch $S_{TX-C}$ such that the transmit circuit 68 can transmit the data read symbols to the master circuit 42.

In an embodiment, the receive circuit 66 can receive the test initiation command $CMD_{INIT}$ from one of the data write telegrams and provide the test initiation command $CMD_{INIT}$ to the mode detector 70. Accordingly, the mode detector 70 can assert the TM pin 64 in response to receiving the test initiation command $CMD_{INIT}$ from the receive circuit 66.

When operating in the test mode, the driver controller 60 will open both the communication transmit switch $S_{TX-C}$ and the communication receive switch $S_{RX-C}$ to decouple the communication circuit 44 from the bus pin 38. The driver controller 60 closes the test receive switch $S_{RX-T}$ and opens the test transmit switch $S_{TX-T}$ to allow the test driver circuit 50 to receive the SI value and the SE value from the test equipment 56 in the data write telegrams. The driver controller 60 opens the test receive switch $S_{RX-T}$ and closes the test transmit switch $S_{TX-T}$ to allow the test driver circuit 50 to transmit the SO value to the test equipment 56 in the data read symbols.

The single-wire bus circuit 36A is configured to transmit the data read symbols via the current sink 80. As described in detail in APP510, the master circuit 42 is configured to always modulate each of the data read symbols to the binary "1" by asserting the higher bus voltage $V_{HIGH}$ and the lower bus voltage $V_{LOW}$ on the single-wire bus 40 based on, for example, the 75% duty cycle. In this regard, the single-wire bus circuit 36A does not need to do anything if the single-wire bus circuit 36A intends to transmit the binary "1" in any of the data read symbols. As a result, the driver circuit 46 can deactivate the current sink 80.

However, the single-wire bus circuit 36A would need to transmit the binary "0" in any of the data read symbols, the single-wire bus circuit 36A would need to pull the higher bus voltage $V_{HIGH}$ down earlier in accordance with the 25% duty cycle. As such, the driver circuit 46 needs to activate the current sink 80 to thereby reduce the higher bus voltage $V_{HIGH}$ on the single-wire bus 40.

In this regard, when operating in the test mode, the test driver circuit 50 will determine whether the SO value represents a binary "0" or a binary "1" in each of the test cycles $T_C(N-1)$, $T_C(N)$, $T_C(N+1)$. The test driver circuit 50 will activate the current sink 80 in response to determining that the SO value equals the binary "0" and deactivate the current sink 80 in response to determining that the SO value equals the binary "1." In an embodiment, the test driver circuit 50 can activate the current sink 80 immediately upon determining that the SO value equals the binary "0."

Those skilled in the art will recognize improvements and modifications to the embodiments of the present disclosure. All such improvements and modifications are considered within the scope of the concepts disclosed herein and the claims that follow.

What is claimed is:

1. A single-wire bus circuit comprising:
   a bus pin coupled to a single-wire bus;
   a communication circuit coupled to the bus pin during a communication mode to carry out normal communications over the single-wire bus and decoupled from the bus pin during a test mode to undergo a test; and
   a driver circuit coupled to the bus pin during the test mode and decoupled from the bus pin during the communication mode and comprising:
      a plurality of test pins coupled to the communication circuit; and
      a test driver circuit configured to operate in the test mode in each of a plurality of test cycles to:
         provide one or more test input values to a first subset of the plurality of test pins to thereby cause the test to be performed in the communication circuit; and
         receive one or more test output values resulting from the test performed in the communication circuit via a second subset of the plurality of test pins; and
   a master circuit coupled to the bus pin via the single-wire bus and configured to communicate a test initiation command to the communication circuit during the communication mode to thereby instruct the communication circuit to switch from the communication mode to the test mode.

2. The single-wire bus circuit of claim 1, wherein the driver circuit further comprises:
   a switch circuit coupled between the bus pin, the communication circuit, and the test driver circuit; and
   a driver controller configured to:
      control the switch circuit to decouple the communication circuit from the bus pin and to couple the test driver circuit to the bus pin in response to an explicit indication of the test mode; and
      control the switch circuit to decouple the test driver circuit from the bus pin and to couple the communication circuit to the bus pin in response to an explicit indication of the communication mode.

3. The single-wire bus circuit of claim 2, wherein:
   the driver circuit further comprises a test mode pin coupled between the driver controller and the communication circuit; and
   the communication circuit is configured to assert a voltage on the test mode pin to provide the explicit indication of the test mode and de-assert the voltage on the test mode pin to provide the explicit indication of the communication mode.

4. The single-wire bus circuit of claim 3, wherein the communication circuit comprises a mode detector configured to:
   assert the voltage on the test mode pin in response to receiving the test initiation command from the master circuit; and
   de-assert the voltage on the test mode pin in response to power cycling of the single-wire bus circuit.

5. The single-wire bus circuit of claim 4, wherein the communication circuit comprises a receive circuit coupled to the bus pin and is configured to:
   receive the test initiation command in the communication mode via the bus pin; and
   provide the test initiation command to the mode detector.

6. The single-wire bus circuit of claim 1, wherein the test driver circuit is further configured to cause a Scan test to be performed in the communication circuit in the test mode.

7. The single-wire bus circuit of claim 6, wherein:
   the plurality of test pins comprises a Scan input (SI) pin, a Scan enable (SE) pin, a clock (CLK) pin, and a Scan output (SO) pin;
   the first subset of the plurality of test pins comprises the SI pin, the SE pin, and the CLK pin;
   the second subset of the plurality of test pins comprises the SO pin; and
   the test driver circuit is further configured to operate in the test mode in each of the plurality of test cycles to:
      provide an SI value, an SE value, and a CLK value to the SI pin, the SE pin, and the CLK pin, respectively, to thereby cause the Scan test to be performed in the communication circuit; and
      receive an SO value resulting from the Scan test performed in the communication circuit via the SO pin.

8. The single-wire bus circuit of claim 7, wherein each of the SI value, the SE value, and the SO value is a voltage pulse-width modulation (PWM) value.

9. The single-wire bus circuit of claim 7, wherein the plurality of test cycles each comprises a first bus symbol, a second bus symbol, and a third bus symbol.

10. The single-wire bus circuit of claim 9, wherein, in each of the plurality of test cycles, the test driver circuit is further configured to:
receive the SI value in the first bus symbol;
receive the SE value in the second bus symbol; and
transmit the SO value in the third bus symbol.

11. The single-wire bus circuit of claim 10, wherein, in each of the plurality of test cycles, the test driver circuit is further configured to derive the CLK value on the third bus symbol.

12. The single-wire bus circuit of claim 10, wherein in each of the plurality of test cycles, the test driver circuit is further configured to:
receive the SI value and the SE value corresponding to an immediately succeeding one of the plurality of test cycles; and
transmit the SO value corresponding to an immediately preceding one of the plurality of test cycles.

13. The single-wire bus circuit of claim 12, wherein the driver circuit further comprises a current sink coupled to the bus pin and is configured in each of the plurality of test cycles to:
determine whether the SO value equals a binary zero or a binary one;
activate the current sink in response to determining that the SO value equals the binary zero; and
deactivate the current sink in response to determining that the SO value equals the binary one.

14. The single-wire bus circuit of claim 13, wherein the test driver circuit is further configured to activate the current sink immediately upon determining that the SO value equals the binary zero.

15. The single-wire bus circuit of claim 7, wherein the plurality of test cycles each comprises a first bus symbol and a second bus symbol.

16. The single-wire bus circuit of claim 15, wherein, in each of the plurality of test cycles, the test driver circuit is further configured to:
receive the SI value and the SE value in the first bus symbol; and
transmit the SO value in the second bus symbol.

17. The single-wire bus circuit of claim 16, wherein, in each of the plurality of test cycles, the test driver circuit is further configured to derive the CLK value on the second bus symbol.

18. The single-wire bus circuit of claim 16, wherein in each of the plurality of test cycles, the test driver circuit is further configured to:
receive the SI value and the SE value corresponding to an immediately succeeding one of the plurality of test cycles; and
transmit the SO value corresponding to an immediately preceding one of the plurality of test cycles.

19. The single-wire bus circuit of claim 18, wherein the driver circuit further comprises a current sink coupled to the bus pin and is configured in each of the plurality of test cycles to:
determine whether the SO value represents a binary zero or a binary one;
activate the current sink in response to determining that the SO value equals the binary zero; and
deactivate the current sink in response to determining that the SO value equals the binary one.

20. The single-wire bus circuit of claim 17, wherein:
the SI value and the SE value each equals a binary zero when the first bus symbol comprises a voltage pulse-width modulation (PWM) value modulated with a twenty-five percent duty cycle;
the SI value equals the binary zero and the SE value equals a binary one when the first bus symbol comprises the voltage PWM value modulated with a fifty percent duty cycle; and
the SI value and the SE value each equals the binary one when the first bus symbol comprises the voltage PWM value modulated with a seventy-five percent duty cycle.

* * * * *